(12) United States Patent
Hoseinzadeh et al.

(10) Patent No.: US 10,996,970 B2
(45) Date of Patent: May 4, 2021

(54) METHOD FOR DATA CENTER STORAGE EVALUATION FRAMEWORK SIMULATION

(71) Applicant: Samsung Electronics Co., Ltd., Gyeonggi-do (KR)

(72) Inventors: Morteza Hoseinzadeh, La Jolla, CA (US); Zhengyu Yang, Malden, MA (US); Terence Ping Wong, San Diego, CA (US); David Evans, San Marcos, CA (US)

(73) Assignee: Samsung Electronics Co., Ltd.

( * ) Notice: Subject to any disclaimer, the term of this patent is extended or adjusted under 35 U.S.C. 154(b) by 476 days.

(21) Appl. No.: 15/896,590

(22) Filed: Feb. 14, 2018

(65) Prior Publication Data

US 2019/0188023 A1 Jun. 20, 2019

Related U.S. Application Data

(60) Provisional application No. 62/598,788, filed on Dec. 14, 2017.

(51) Int. Cl.
*G06F 9/455* (2018.01)
*G06F 9/4401* (2018.01)
*G06F 30/20* (2020.01)

(52) U.S. Cl.
CPC ........ *G06F 9/45558* (2013.01); *G06F 9/4401* (2013.01); *G06F 30/20* (2020.01); *G06F 9/45508* (2013.01); *G06F 2009/45579* (2013.01); *G06F 2009/45595* (2013.01)

(58) Field of Classification Search
USPC .......................... 703/6, 22, 26, 24; 716/104
See application file for complete search history.

(56) References Cited

U.S. PATENT DOCUMENTS

| 6,028,996 A | | 2/2000 | Sniderman et al. | |
| 6,970,858 B1 | * | 11/2005 | Nichols | G09B 7/04 706/47 |
| 7,100,195 B1 | * | 8/2006 | Underwood | G06F 9/451 726/2 |
| 7,437,614 B2 | * | 10/2008 | Haswell | G06F 11/3684 714/38.13 |
| 8,589,133 B1 | | 11/2013 | Dalessandro et al. | |

(Continued)

FOREIGN PATENT DOCUMENTS

| JP | 2007 208633 | 8/2007 |
| JP | 2010 219677 | 9/2010 |

*Primary Examiner* — Thai Q Phan
(74) *Attorney, Agent, or Firm* — The Farrell Law Firm, P.C.

(57) ABSTRACT

An a method for simulating a data center is provided and a non-transitory computer-readable storage medium having recorded thereon a computer program for executing the method of simulating a data center. The method includes storing at least one hardware configuration file and at least one functional description file of a data center to be simulated in a configuration file application; generating a simulation program of the data center using the at least one hardware configuration file and the at least one functional description file by a data center storage evaluation framework (DCEF) application; and executing a flow-based simulation on the simulation program generated by the DCEF application by a simulator.

20 Claims, 7 Drawing Sheets

(56) References Cited

U.S. PATENT DOCUMENTS

| | | | |
|---|---|---|---|
| 9,727,440 B2 | 8/2017 | Suit | |
| 10,387,605 B2* | 8/2019 | Mneimneh | G06F 30/398 |
| 2003/0229482 A1* | 12/2003 | Cook | G06F 30/30 |
| | | | 703/14 |
| 2008/0120129 A1* | 5/2008 | Seubert | G06Q 10/10 |
| | | | 705/35 |
| 2009/0254891 A1* | 10/2009 | Cui | G06F 8/53 |
| | | | 717/138 |
| 2010/0292976 A1 | 11/2010 | Newcombe et al. | |
| 2013/0268255 A1* | 10/2013 | Harrison | G06N 3/006 |
| | | | 703/6 |
| 2013/0290918 A1* | 10/2013 | Baumgartner | G06F 30/3323 |
| | | | 716/104 |
| 2016/0055222 A1* | 2/2016 | Sarferaz | G06F 16/254 |
| | | | 707/603 |
| 2016/0379312 A1* | 12/2016 | Arjomand | G06Q 30/0279 |
| | | | 705/30 |
| 2017/0032695 A1 | 2/2017 | Brueckner et al. | |

* cited by examiner

US 10,996,970 B2

METHOD FOR DATA CENTER STORAGE EVALUATION FRAMEWORK SIMULATION

PRIORITY

This application claims priority under 35 U.S.C. § 119(e) to a U.S. Provisional patent application filed on Dec. 14, 2017 in the United States Patent and Trademark Office and assigned Ser. No. 62/598,788, the entire contents of which are incorporated herein by reference.

FIELD

The present disclosure relates generally to a method and an apparatus for simulation, and more particularly, to a method and apparatus for data center storage evaluation framework (DCEF) simulation.

BACKGROUND

Organizing a data center with tens of physical host machines running hundreds of virtual machines is costly and time-consuming. This is even more tangible when a company upgrades an existing data center to potentially benefit from installing new devices like new processors, emerging memory technologies, or high-end storage devices, or employing new management algorithms like resource allocation. However, upgrading an entire system is not only expensive but may also harm ongoing tasks on a data center and incur even more expense, where the results may not be worth the effort.

Thus, there is a need for an apparatus and a method of evaluating and estimating performance changes (e.g., an improvement or a degradation) brought on by hardware and software changes to a datacenter storage system, without physically changing hardware and software.

SUMMARY

According to one embodiment, a method of simulating a data center is provided. The method includes storing at least one hardware configuration file and at least one functional description file of a data center to be simulated in a configuration file application; generating a simulation program of the data center by a DCEF application using the at least one hardware configuration file and the at least one functional description file; and executing a flow-based simulation on the simulation program generated by the DCEF application by a simulator.

A non-transitory computer-readable recording medium having recorded thereon a computer program for executing a method of simulating a data center is provided. The method storing at least one hardware configuration file and at least one functional description file of a data center to be simulated in a configuration file application; generating a simulation program of the data center using the at least one hardware configuration file and the at least one functional description file by a data center storage evaluation framework (DCEF) application; and executing a flow-based simulation on the simulation program generated by the DCEF application by a simulator.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION OF EMBODIMENTS OF THE PRESENT DISCLOSURE

Figure 1A:
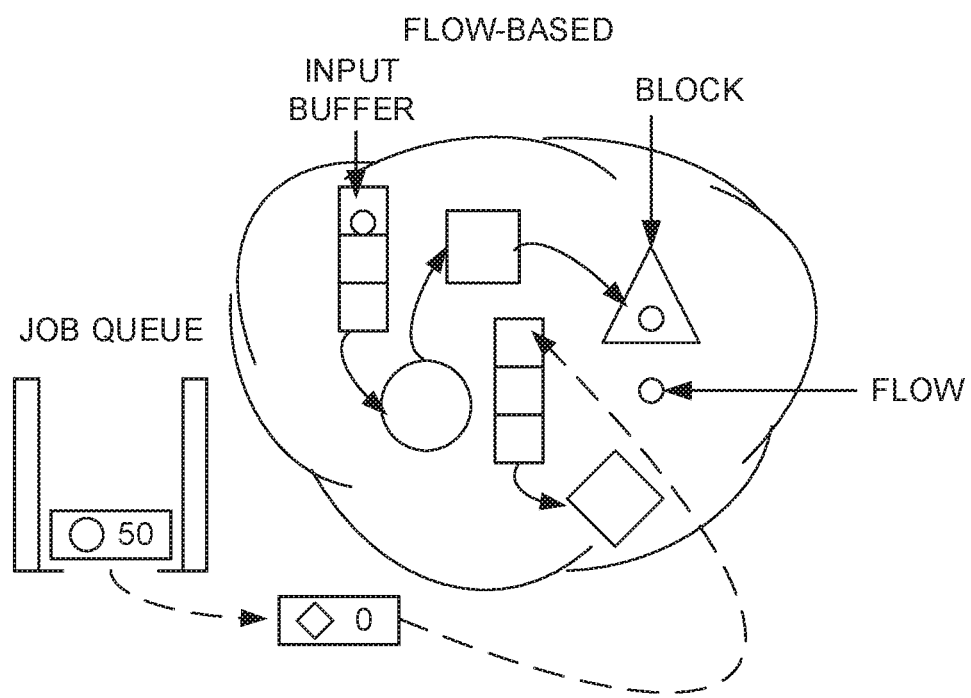
FIG. 1A is an illustration of a flow-based simulation, according to one embodiment.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

The present disclosure concerns evaluating and estimating performance changes (e.g., an improvement or a degradation) brought on by hardware and software changes to a data center storage system without physically changing hardware and software. Thus, a data center administrator may easily address storage resource management and optimization issues in a data center that includes heterogeneous storage media (e.g., a solid state drive (SSD) and a hard disk drive (HDD)) and complex network topologies.

According to one embodiment, a company may evaluate a new or proposed installation of a data center through flow-based simulation on a single machine without to expend funds to physically install the data center.

According to one embodiment, the present disclosure is module-based, highly encapsulated, pluggable, and scalable.

According to one embodiment, the present disclosure uses automatic programming to generate a simulator program based on user hardware configuration description files.

According to one embodiment, the present disclosure may conduct multiple types of performance evaluations, where a generated simulator reads workload samples (e.g., workload trace metadata), simulates performance using a flow-based methodology, and outputs numerous performance metrics, such as input/output (I/O) performance, energy consumption, total cost of ownership (TCO), a reliability audit, and availability.

According to one embodiment, the present disclosure includes a decision making assistant, where decisions may be made by a system administrator or by the system automatically for load balancing (including virtual machine disk (VMDK) migration), and reorganizing a topology of a data center to improve performance, based on performance evaluation results of different hardware configurations under a certain workload pattern.

Figure 1B:
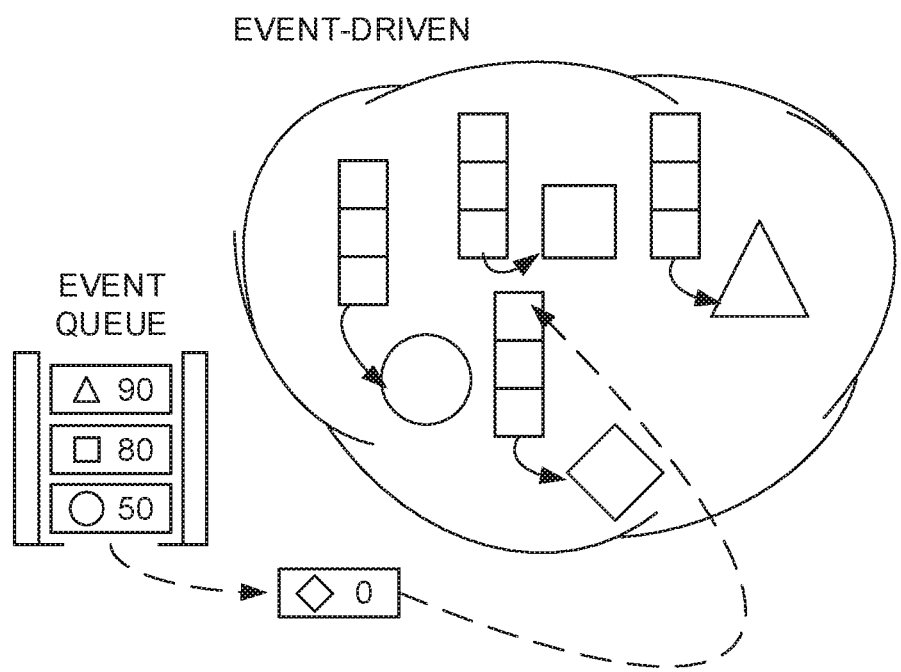
FIG. 1B is an illustration of an event-driven simulation, according to one embodiment.

FIG. 1A is an illustration of a flow-based simulation and FIG. 1B is an illustration of an event-driven simulation, according to one embodiment.

Referring to FIGS. 1A and 1B, current computer system simulators may be categorized into two major classes: timing simulators which may be either cycle-driven or event-driven, and functional simulators. A cycle-driven simulator is usually used to simulate low-level microarchitectures like a CPU or an electronic system, mainly for timing/power measurements, which provides extremely accurate results at the cost of very slow execution (1-1000 KIPS).

An event-driven simulator is usually used to simulate high-level computer systems, where every possible event in a system is described and precisely handled. An event-drive simulator is much faster than a cycle-driven simulator. The cycle-driven simulator and the event-driven simulator can each simulate concurrency, but their rigid implementation does not allow users to easily simulate arbitrary computer systems. As a result, the cycle-driven simulator and the event-driven simulator, by themselves, each lack of flexibility, which may require a long development time. On the other hand, while a functional simulator may only requires a short development time, the functional simulator, by itself, does not provide any information about physical characteristics since the functional simulator is merely used to verify functionality.

Many timing simulators use event-driven and backward-looking models, and a memory element has a history instead of a single value. Flow-based simulation leverages the key insight that a complex algorithm may be better understood when it is serialized. Thus, in contrast with event-driven methods in which an invocation time of events is sophisticated (e.g., depends on many factors), in a flow-based technique, event-driven methods are predictable because of serial execution.

The goal of flow-based simulation is to let architects measure the performance, energy consumption, and functional verification by simulating only the functionality. In a flow-based simulator, the content of every memory element under simulation is bonded to time. Conceptually, time is a global floating point number which may increase or decrease. Since the state of a system is also time-bonded, it is possible to rollback a sequence of events after a call chain, which is referred to as a flashback.

In the present disclosure, a flow-based simulation methodology is employed. That is, a flow is defined as a sequence of events occurring successively which is triggered by invoking a routine and ends when a program counter returns from that routine. A routine is a piece of code that describes the functionality of an element, which is referred to as a block, in a system. Besides task functions, each block has a latency/power component which is used for timing/energy evaluation. A block may receive a job and process the job. In addition, a block may optionally produce other jobs and send the produced jobs to a job queue, similar to an event-driven simulation, but at a higher level.

Flow-based techniques rely on a call stack to resemble buffering in hardware, so that a programmer need not use a job queue very frequently. As shown in FIGS. 1A and 1B, in the event-driven method of simulation, all blocks dispatch events to invoke each other, while in the flow-based method of simulation the blocks may call each other directly. However, it is still possible to use a job queue to invoke a block which is usually used by a block to call itself, which is referred to as loopback. Flow-based simulation, additionally, enables fast development by compacting parts of a simulated system into a single block depending on the level of abstraction.

Figure 2:
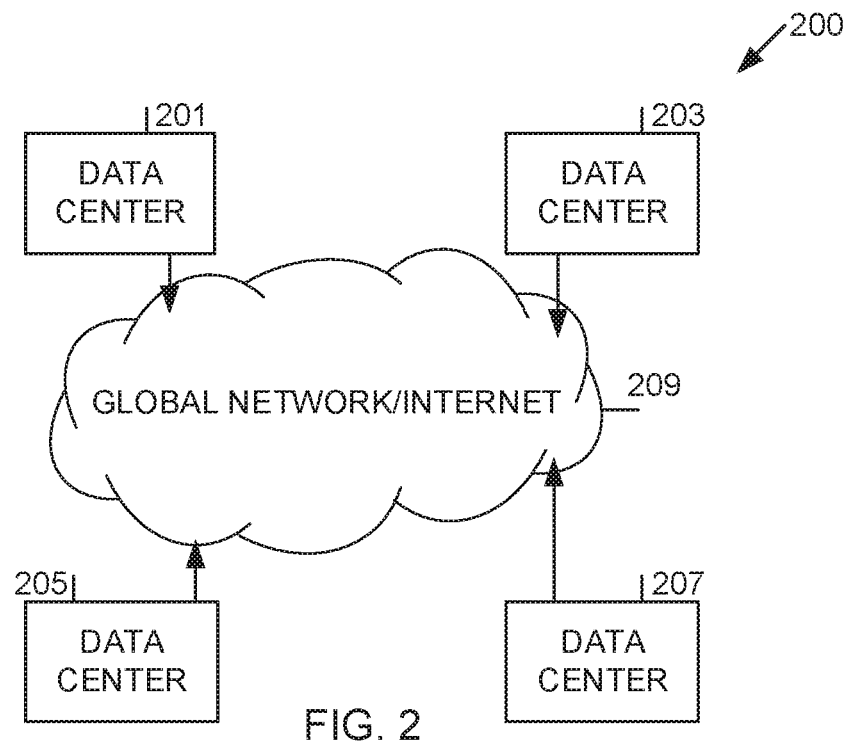
FIG. 2 is a block diagram of an architecture of data centers, according to one embodiment.

FIG. 2 is a block diagram of an architecture 200 of data centers 201, 203, 205, and 207, according to one embodiment.

Referring to FIG. 2, the architecture 200 may include a first data center 201, a second data center 203, a third data center 205, a fourth data center 207, and a global network/Internet 209. The first data center 201, the second data center 203, the third data center 205, the fourth data center 207 are each connected to the global network/Internet 209. While four data centers 201, 203, 205, and 207 are illustrated in FIG. 2, the present disclosure is not limited thereto. The architecture 200 may include any number of data centers (e.g., local networks). A connection between a data center 201, 203, 205, and 207 and the global network/Internet 209 may be a wireless connection, a wired connections, or any combination thereof.

Each of the data centers 201, 203, 205, and 207 may have multiple hosts (e.g., physical host machines or servers) as described in more detail below with reference to FIG. 3. A virtual machine (VM) and hypervisor (software) may operate on a host machine. Multiple VMs may operate on a hypervisor.

Figure 3:
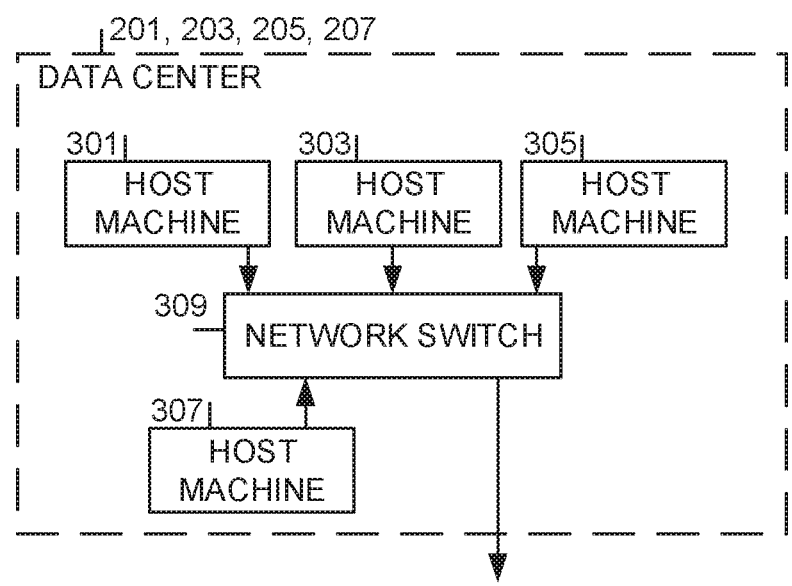
FIG. 3 is a block diagram of a data center of FIG. 2, according to one embodiment.

FIG. 3 is a block diagram of the data centers 201, 203, 205, and 207 of FIG. 2, according to one embodiment.

Referring to FIG. 3, each of the data centers 201, 203, 205, and 207 may include a first host machine 301, a second host machine 303, a third host machine 305, a fourth host machine 307, and a network switch 309. The first host machine 301, the second host machine 303, the third host machine 305, and the fourth host machine 307 are connected to the network switch 309. While four host machines 301, 303, 305, and 307 are illustrated in FIG. 3, the present disclosure is not limited thereto. The data centers 201, 203, 205, and 207 may include any number of host machines. A connection between a host machine and the network switch 309 may be a wireless connection, a wired connections, or any combination thereof.

Inside each host machine 301, 303, 305, and 307, different hardware devices may be included, such as a central processing unit (CPU), memory (dual in-line memory module (DIMM)/nonvolatile DIMM (NVDIMM)), HDD, SSD, network interface controller (NIC), and interfaces (e.g., address/data (ADDR/DATA) bus, a peripheral component interconnect (PCI) bus, a PCI express (PCI-e) bus, a serial advanced technology attachment (SATA) bus, and an intelligent drive electronics (IDE) bus).

Figure 4:
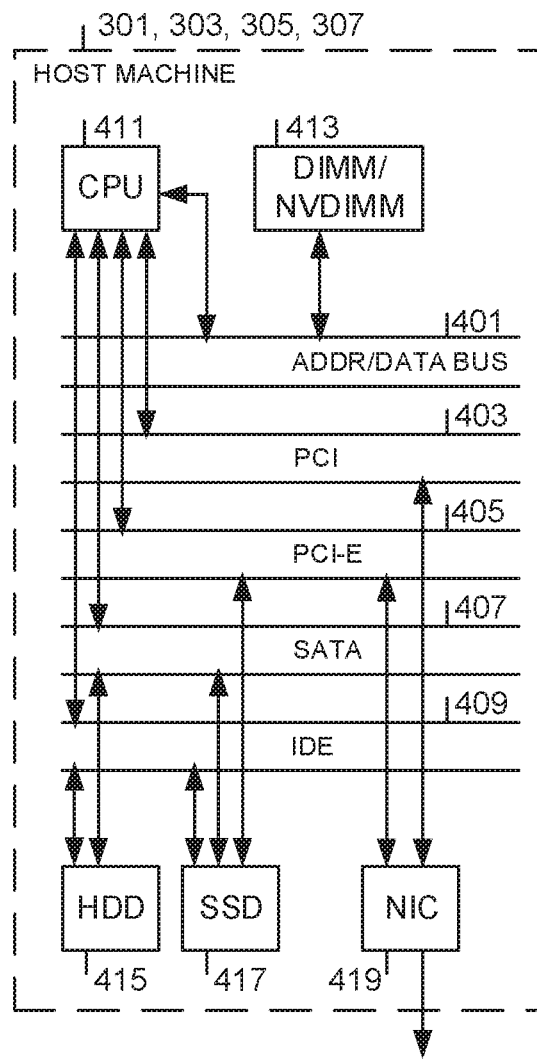
FIG. 4 is a block diagram of a host machine of FIG. 3, according to one embodiment.

FIG. 4 is a block diagram of the host machine 301, 303, 305, and 307 of FIG. 3, according to one embodiment.

Referring to FIG. 4, each of the host machines 301, 303, 305, and 307 may include an ADDR/DATA bus 401, a PCI bus 403, a PCI-e bus 405, a SATA bus 407, an IDE bus 409, a CPU 411, a DIMM/NVDIMM 413, an HDD 415, an SSD 417, and a NIC 419. The CPU 411 is connected to the ADDR/DATA bus 401, the PCI bus 403, the PCI-e bus 405, the SATA bus 407, and the IDE bus 409. The DIMM/NVDIMM 413 is connected to the ADDR/DATA bus 401. The HDD 415 is connected to the SATA bus 407 and the IDE bus. The SSD 417 is connected to the PCI-e bus 405, the SATA bus 407, and the IDE bus 409. The NIC 419 is connected to the PCI bus 403 and the PCI-e bus 405. While a certain configuration for the host machines 301, 303, 305, and 307 is illustrated in FIG. 4, the present disclosure is not limited thereto, and other configurations are possible.

Figure 5:
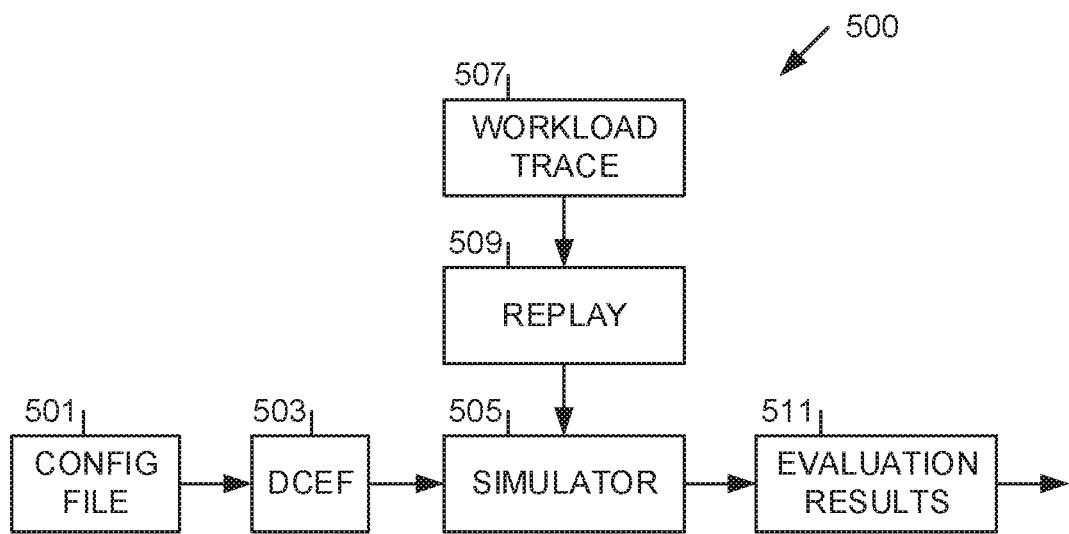
FIG. 5 is a block diagram of a DCEF workflow, according to one embodiment.

FIG. 5 is a block diagram of a DCEF workflow application 500, according to one embodiment.

Referring to FIG. 5, the DCEF workflow application 500 may include a configuration file (config file) application 501, a DCEF application 503, a simulator 505, a workload trace application 507, a replay application 509, and an evaluation results application 511. The configuration file application 501 may provide different hardware and software configuration files to the DCEF application 503. That is, the present disclosure allows for different types of descriptions (e.g., hardware descriptions and software/functional descriptions) at multiple levels of abstraction. The DCEF application 503 generates a simulator using at least one hardware configuration file and at least one functional description file and provides it to the simulator 505. The DCEF application 503 builds models of components (including software) from a device pool, and assembles them to build a simulator. Then, the workload trace application 507 provides a workload trace to the replay application 509, and the replay application 509 provides the workload trace to the simulator 505 to be replayed to generate evaluation results. The simulator 505 provides the evaluation results to the evaluation results application 511.

In an embodiment, a non-transitory computer-readable recording medium having recorded thereon a computer program for executing the method of simulating a data center illustrated in FIG. 5.

Figure 6:
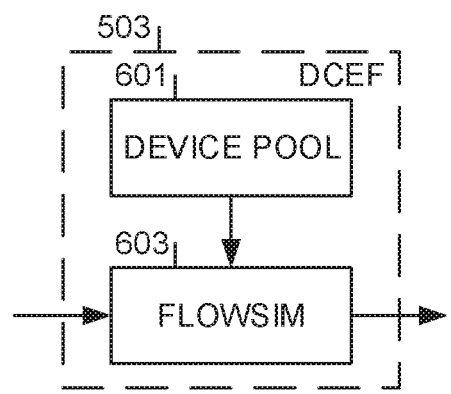
FIG. 6 is a block diagram of a DCEF of FIG. 5, according to one embodiment.

FIG. 6 is a block diagram of the DCEF application 503 of FIG. 5, according to one embodiment.

Referring to FIG. 6, the DCEF application 503 may include a device pool application 601 and a flow simulator (flowsim) application 603. The device pool application 601 provides an output to the flow simulator application 603, where the flow simulator application 603 receives a configuration file from the configuration file application 501 in FIG. 5, generates a simulation program using at least one hardware configuration file and at least one functional description file, and outputs the simulation program to the simulator application 505. The flow simulator application 603 uses the configuration file to determine which devices from the device pool 601 to include in the simulation program.

Figure 7:
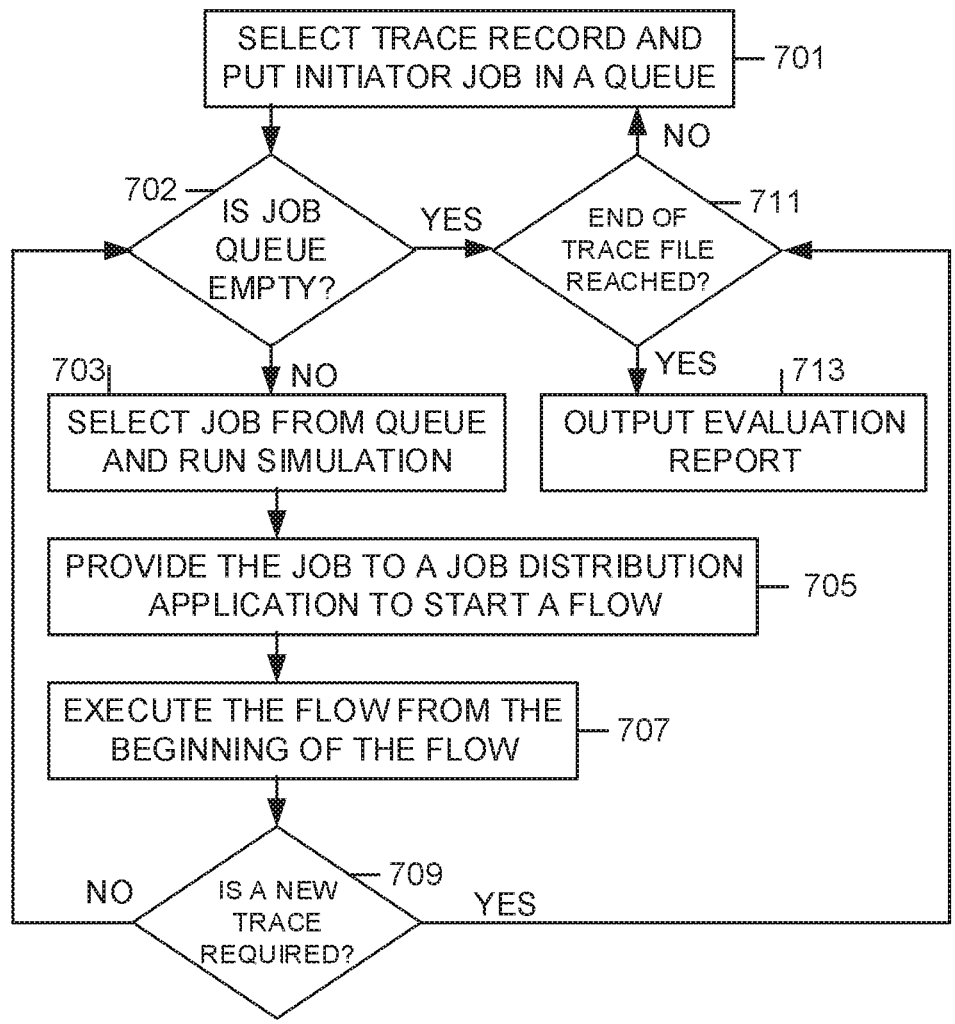
FIG. 7 is a flowchart of a method of simulating an execution flow, according to one embodiment.

FIG. 7 is a flowchart of a method of simulating an execution flow, according to one embodiment.

Referring to FIG. 7, at 701, a trace record is selected and an initiator job is put into a job queue.

At 702, it is determined if the job queue is empty. If the job queue is not empty, the method proceeds to 703. If the job queue is empty, the method proceeds to 711.

At 703, a job is selected from the job queue and provided to a simulator (e.g., a flow-based simulator) to run a simulation on the job. For example, trace records from a trace file are provided one by one to the flow-based simulator, where the simulator produces corresponding jobs and provides each job to a job distribution application of a simulator (e.g. the simulator 505 in FIG. 5) described below in greater detail. In an embodiment, the job distribution application may be a job distribution application.

At 705, the job distribution application starts a flow for the job. That is, for each job in the job queue that is provided to the job distribution application, the job distributing application tries to start a flow.

At 707, a flow started by the job distribution application is executed from its beginning. That is, for a flow that is started, the flow returns to its beginning to be executed.

At 709, it is determined if a new trace is required. If a new trace is not required, the method returns to 702. If a new trace is required, the method proceeds to 711.

At 711, it is determined if the end of the trace file is reached. If the end of the trace file is not reached then the method returns to 701. If the end of the trace file is reached then the method proceeds to 713.

At 713, an evaluation report is provided (e.g., output, printed). That is, when all of the jobs in the trace file are finished, an evaluation report is provided.

Figure 8:
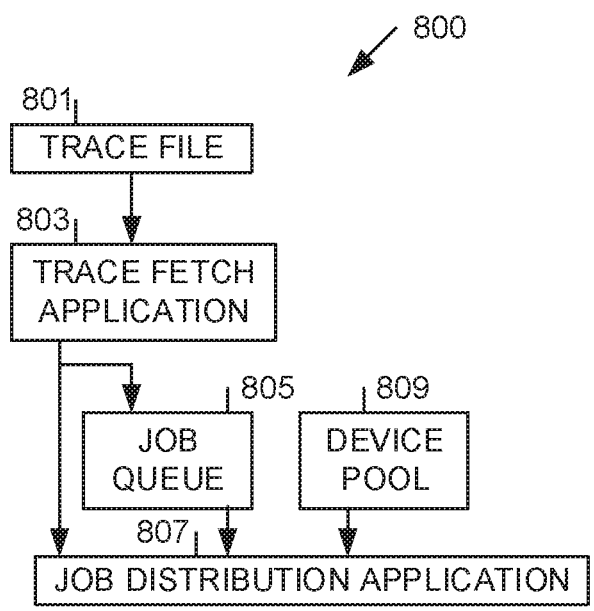
FIG. 8 is a flowchart of a method of job distribution and execution, according to one embodiment.

FIG. 8 is a flowchart of a method 800 for job distribution and execution, according to one embodiment. Job distribution and execution is conducted in a simulator (e.g. the simulator 505 in FIG. 5).

Referring to FIG. 8, the method 800 includes a trace file application 801, a trace fetch application 803, a job queue application 805, a job distribution unit 807, and a device pool application 809. The trace file application 801 provides an output to the trace fetch application 803. The trace fetch application 803 provides an output to the job queue 805 and the job distribution application 807. The job queue application 805 and the device pool application 809 each provide an output to the job distribution application.

The method 800 executes the simulator generated by the DCEF.

Figure 9:
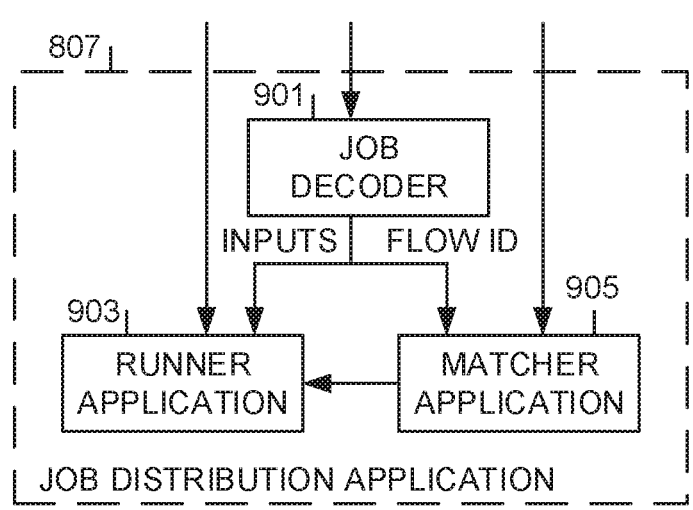
FIG. 9 is a flowchart of a job distribution application of FIG. 8, according to one embodiment.

FIG. 9 is a flowchart of the job distribution application 807 of FIG. 8, according to one embodiment.

Referring to FIG. 9, the job distribution application 807 includes a job decoder 901, a runner application 903, and a matcher application 905. The job decoder 901 receives an input from the job queue 805 of FIG. 8 and provides an output to the runner application 903 and the matcher application 905 for providing inputs to the runner application 903 and flow IDs to the matcher application 905. The runner application 903 receives an input from the trace fetch application 803 of FIG. 8, and the matcher application 905 receives an input from the device pool application 809 in FIG. 8.

The job distributing application 807 receives a job from the job queue application 805 and decodes the job in the job decoder 901 to obtain the job's flow identifier (ID) and metadata. Then, the flow ID is sent to a matcher application 905, and the matcher application 905 uses the flow ID to look up corresponding device object descriptions in the device pool application 809. The device pool application 809 contains pointers to all object descriptions including both hardware and software components, and has information on all of the components of a system in a database.

The matcher application 905 looks up corresponding device object descriptions in the device pool application 809. A device model is built from the device object descriptions, and a runner for the built device initializes and operates the built device model. Additionally, one or more new job(s) may be dispatched to the job queue if necessary. The job queue application 805 may not empty if a hardware device includes an endless loop to keep it active.

Figure 10:
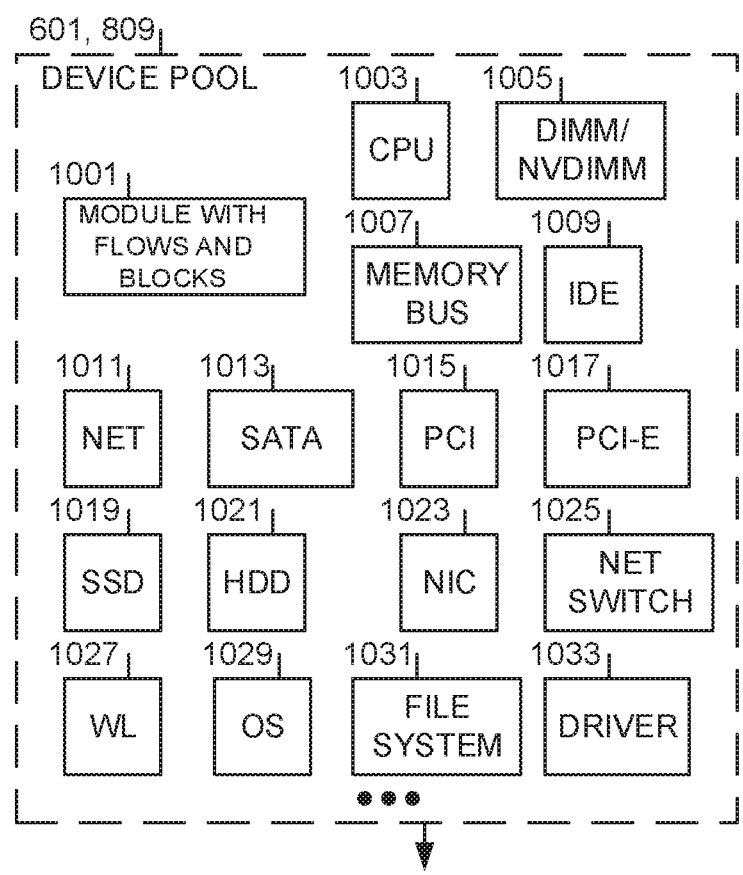
FIG. 10 is a block diagram of a device pool application of FIGS. 6 and 8, according to one embodiment.

FIG. 10 is a block diagram of a device pool application of FIGS. 6 and 8, according to one embodiment.

Referring to FIG. 10, the device pool application includes at least a device flows and blocks 1001. In an embodiment, the device pool may include at least one of a CPU 1003, a DIMM/NVDIMM 1005, a memory bus 1007, an IDE 1009, a network (NET) device 1011, a SATA 1013, a PCI 1015, a PCI-e 1017, an SSD 1019, an HDD 1021, a NIC 1023, a network switch 1025, a workload (WL) device 1027, an operating system (OS) 1029, a file system 1031, and a driver application 1033. However, the device pool application is not limited to these components, and other components may be included.

A hardware description and programming language (HDPL) for the present disclosure may be defined as follows:

$$n \in \mathbb{R}$$
$$v \in \text{Identifier}$$
$$\oplus \in \text{Operator}$$
$$C \in \text{Class}$$
$$P \in \text{PrimitiveType}$$
$$q \in \text{TypeQualifier}$$
$$p \in \text{Parameter}$$
$$\eta \in \text{Specification}$$
$$m \in \text{Module} ::= \text{module } m \text{ extends } m'\{\vec{d}\}$$
$$d \in \text{Descriptor} ::= \vec{p}|\vec{\eta}|\vec{\rho}|\vec{f}|\vec{c}|\vec{\alpha}|\vec{s}$$
$$\rho \in \text{PortDe } f ::= \text{input } T \rho[e]|\text{output } T \rho[e]|\text{inout } T \rho[e]$$
$$f \in \text{Field} ::= f \text{ from } e \text{ to } e$$
$$c \in \text{Connection} ::= \rho_1 \leftarrow \rho_2|\rho_1 \rightarrow \rho_2|\rho_1 \leftrightarrow \rho_2|\rho_1 = \rho_2|$$

-continued $$\alpha \in \text{Architecture} ::= r|\psi$$
$$s \in \text{Slot} ::= \text{slot } s \, (\vec{Tv}):T\vec{\gamma}\{\vec{\omega}\}$$
$$e \in \text{Exp} ::= n|p|v|v[e]|e \oplus e|(e)|s(\vec{e})|e@f|\text{null}$$
$$r \in \text{StoreElement} ::= \text{storage } r \, [e]\{r \mid Tv\}$$
$$\psi \in \text{Pipline} ::= \text{pipeline } \psi \, (\vec{Tv}) \, \{\vec{\tau}\}$$
$$\tau \in \text{Stage} ::= \text{stage } \tau \, (\vec{Tv}) \text{ when } e$$
$$T \in \text{Type} ::= C \mid q \mid P$$
$$\gamma \in \text{PhysChar} ::= \sim\gamma(e)$$
$$\omega \in \text{Statement} ::= (C++ \text{ Statement})$$
$$|\text{serial } \{\vec{\omega}\}$$
$$|\text{concurrent } \{\vec{\omega}\}$$
$$|\text{fire } \{\vec{\psi}\}$$

In the HDPL, hardware description languages and programming languages are merged. With the HDPL, a user may describe a hardware device using a programming language. An example HDPL may be an extension of C++ for module description. The syntax is described above. Such an HDPL enables a user to define a new hardware module with a pipeline inside C++ code. Other programming language implementations are specifically envisioned.

An HDPL syntax template is as follows:

```
module <name> extends <base-module>
{
parameters:
    <name> = <value>;
specifications:
    <name> = <value>;
channels:
    input <type> <port1>[<size>], <ports2>[<size>], ...;
    output <type> <port1>[<size>], <ports2>[<size>], ...;
    inout <type> <port1>[<size>], <ports2>[<size>], ...;
architecture:
    storage <name>[<size>]
    {
        ...
    }
pipeline <name>[<size>](...)
    {
        stage <name>(...) when <perform cond>;
    }
submodule <name>(...) extends, base-module>
    {...}
    hist <type> <name>[<size>];  // variables with history
    <type> <name>[<size>];       // regular variables
topology:
    <input/inout> ← <output/inout>;
    <output/inout> → <input/inout>;
    <inout/inout> ←→ <inout>;
    <input> = <input> ← <output/inout>;
fields:
    <name> from <value> to <value>;
implementation:
    block <name>(...); <return type>
    ~latency(...) ~active_power(...) ~passive_power(...)
    {
        ...
    }
    block <input/inout port>(int index, <type> data)
    ~latency(...) ~active_power(...) ~passive_power(...)
    {
        ...
    }
    block <pipeline stage>(...)
    ~latency(...) ~active_power(...) ~passive_power(...)
    {
        fire <pipeline>[<index>](...);
        concurrent {
            ...
        }
        serial {
```

```
        ...
      }
    }
  }
```

Template code for describing a generic module is described above. The description may be for both hardware and software modules. A flow-based simulation method and design is used as a transpiler, which takes code in HDPL and generates its equivalent C++ code to implement a flow-based simulation of a described system. A user need only care about the functionality, and latency/power components of each block (which may be an estimation). The overall timing measurement is conducted by the transpiler. A flow-based method is used to make the transformation from HDPL to C++ easier, and make the cycle-accurate simulation faster. However, the present disclosure is not limited to using only a flow-based method. Event-driven and cycle-driven methods may also be used. Only a functional simulation may be considered in a case where a user is only interested in investigating functionality in a faster way.

A module description may include multiple scope specifiers as follows:

A scope specifier "parameters" is used to parametrize the module. A parameter may be used everywhere throughout a module description. A parameter is similar to a template class in C++, but is more specialized in HDPL. For example, a parameter may alter the functionality of a module or alter a dimension of a member array.

A scope specifier "specifications" is used to reconfigure a base-module, where the base module's parameters may be modified using this scope specifier of an inheritor module.

A scope specifier "channels" is used to implement a channel as a C++ class consisting of a set of access functions and a buffer. A module may have three types of channels to provide various conductivities: input, output, and inout.

A scope specifier "input" is used to specify a connection that can only be connected to an output channel of another module. An input channel may be listened to, read, and flushed within the module description scope.

A scope specifier "output" is an output port that may be connect to another module's input channel. The output port may be connected to several input channels.

A scope specifier "inout" is a full-duplex channel which may be read and written from both sides. An inout may be connected only to another module's input, output, and inout channel.

A scope specifier "architecture" contains architectural declarations of a module, which may include multiple instances of objects, storage, pipeline, submodule, and variables.

A scope specifier "storage" describes a logical structure of a storage space of a device, which may form an access tree such as hdd.sector.page.line. The storage structure is similar to a regular structure in C, but the storage structure implements a complicated class which stores a history of modifications inside a hash table with a tiering or cutoff algorithm.

A scope specifier "pipeline" is a main description of a module's functionality. A module performs its tasks in one or more described pipelines. A pipeline includes a name for referring to the pipeline, a dimension to enable a super-pipeline, and some possible inputs. To describe a pipeline, its stages should be listed inside the body of the pipeline. Each stage is a function call which is described below with reference to an "implementation" scope of a module. Moreover, a pipeline may be conditional, which indicates that it is possible to perform a pipeline stage only when a particular condition exists.

A scope specifier "submodule" is similar to defining a new module, but a submodule is restricted to being used only inside the submodule's parent module.

A scope specifier "variables" is similar to a C++ class structure. It is possible to instantiate some variables, arrays, structures (or structs), classes, and modules inside a module. A variable may be declared by a "hist" specifier which makes it time-bonded by assigning a history of modifications to the variable. Such variables may be accessed by using getter and setter methods. Notice that, hist may also be used inside a storage structure.

A scope specifier "topology" is used to describe a connectivity of submodules.

A scope specifier "fields" describes address fields. A field may be used later in a format of addr@field which returns a particular bit-range of the address.

A scope specifier "implementation" describes all function bodies. In addition, a pipeline stage may be used in an architecture scope. A function is described in the form of a block, which includes a name, a possible input vector, a possible output type, physical characteristics such as latency and power, and a function body. The body is C++ code with some additional keywords for timing simulation: fire, wait, serial, and concurrent.

A scope specifier "fire" puts a job in a simulator job queue for starting a pipeline.

A scope specifier "wait" is used to call another block and make a caller busy.

A scope specifier "serial" is a code block which makes everything inside it run serially or sequentially.

A scope specifier "concurrent" is a code block which makes everything inside it run concurrently.

An application of the present disclosure varies based on the need. Overall, the simulator generates a complete report in terms of performance, energy, and reliability.

The term "performance" indicates an estimation of the performance of a whole system and a report of accurate results of running a given workload of a data center. Performance may also include throughput, bandwidth, and total execution time.

The term "throughput" reports a number of input/output (I/O) operations per second (IOPS) for each part of a system based on a user's requirement.

The term "bandwidth" is a report of an exact bandwidth of devices including storage and networking devices after a simulation is completed.

The term "total execution time" is an estimate of a total execution time for each workload, which may be helpful for estimating costs.

The term "energy" is a complete report at the completion of a simulation for energy consumption of each physical device, as well as an estimate of a whole data center.

The term "reliability" indicates that a simulator may receive a reliability model for each device and estimate each device's life time, failure rate, drop rate, mean time to failure, recovery, repair, mean time between failures, and mean down time.

Based on the output reports, it is possible to calculate a total cost of ownership, availability, and several other measurements and estimations.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. A method of simulating a data center, comprising:
   storing at least one hardware configuration file and at least one functional description file of a data center to be simulated in a configuration file application;
   generating a simulation program of the data center using the at least one hardware configuration file and the at least one functional description file by a data center storage evaluation framework (DCEF) application;
   executing a flow-based simulation on the simulation program generated by the DCEF application by a simulator,
   fetching trace records, by a trace fetch application in the simulator, from a trace file application and producing corresponding jobs,
   entering the corresponding jobs in a job queue, and
   initiating a flow and executing the flor by a job distribution application.

2. The method of claim 1, further comprising:
   storing, in the DCEF application, models of a plurality of devices from which the data center is constructed in a device pool application; and
   generating, by a simulator program generator in the DCEF application, the simulation program of the data center.

3. The method of claim 2, wherein the plurality of devices from which the data center is constructed includes a central processing unit (CPU), memory including a dual in-line memory application (DIMM)/nonvolatile DIMM (NVDIMM)), a hard disk drive (HDD), a solid state drive (SSD), a network interface controller (NIC), a network switch, an operating system, a workload application, a file system, a driver, a device with flows and blocks, and interfaces including an address/data (ADDR/DATA) bus, a peripheral component interconnect (PCI) bus, a PCI express (PCI-e) bus, serial advanced technology attachment (SATA) bus, and an intelligent drive electronics (IDE) bus.

4. The method of claim 1, further comprising receiving, by the simulator, workload trace metadata and output performance metrics.

5. The method of claim 4, wherein the performance metrics include at least one of input/output (I/O) performance, energy consumption, total cost of ownership (TCO), reliability, and availability.

6. The method of claim 5, wherein I/O performance includes throughput, bandwidth, and total execution time.

7. The method of claim 4, further comprising performing load balancing and topology reorganization, by a decision-making application, to improve performance of the data center based on the performance metrics.

8. The method of claim 1, further comprising:
   storing the trace records in a trace file application in the simulator.

9. The method of claim 8, further comprising:
   decoding a job to obtain a flow identifier (ID) and metadata by a job decoder in the job distribution application;
   initializing and operating the built data center by a runner application in the job distribution application; and
   looking up corresponding device object descriptions in the device pool application by a matcher application in the job distribution application.

10. The method of claim 1, wherein the data center is comprised of multiple host machines, wherein a host machine is one of a virtual machine (VM) and a hypervisor.

11. A non-transitory computer-readable recording medium having recorded thereon a computer program for executing a method of simulating a data center, the method comprising:
    storing at least one hardware configuration file and at least one functional description file of a data center to be simulated in a configuration file application;
    generating a simulation program of the data center using the at least one hardware configuration file and the at least one functional description file by a data center storage evaluation framework (DCEF) application;
    executing a flow-based simulation on the simulation program generated by the DCEF application by a simulator;
    fetching trace records, by a trace fetch application in the simulator, one by one from a trace file application and producing corresponding jobs;
    entering the corresponding jobs in a job queue; and
    initiating a flow and executing the flor from a beginning of the flow by a job distribution application.

12. The non-transitory computer-readable recording medium of claim 11, the computer program further comprising:
    storing, in the DCEF application, models of a plurality of devices from which the data center is constructed in a device pool application; and
    generating, by a simulator program generator in the DCEF application, the simulation program of the data center.

13. The non-transitory computer-readable recording medium of claim 12, wherein the plurality of devices from which the data center is constructed includes a central processing unit (CPU), memory including a dual in-line memory application (DIMM)/nonvolatile DIMM (NVDIMM)), a hard disk drive (HDD), a solid state drive (SSD), a network interface controller (NIC), a network switch, an operating system, a workload application, a file system, a driver, a device with flows and blocks, and interfaces including an address/data (ADDR/DATA) bus, a peripheral component interconnect (PCI) bus, a PCI express (PCI-e) bus, serial advanced technology attachment (SATA) bus, and an intelligent drive electronics (IDE) bus.

14. The non-transitory computer-readable recording medium of claim 11, the computer program further comprising receiving, by the simulator, workload trace metadata and output performance metrics.

15. The non-transitory computer-readable recording medium of claim 14, wherein the performance metrics include at least one of input/output (I/O) performance, energy consumption, total cost of ownership (TCO), reliability, and availability.

16. The non-transitory computer-readable recording medium of claim 15, wherein I/O performance includes throughput, bandwidth, and total execution time.

17. The non-transitory computer-readable recording medium of claim 14, further comprising performing load balancing and topology reorganization, by a decision-making application, to improve performance of the data center based on the performance metrics.

18. The non-transitory computer-readable recording medium of claim 11, the computer program further comprising:
    storing the trace records in the trace file application in the simulator.

19. The non-transitory computer-readable recording medium of claim 18, the computer program further comprising:
- decoding a job to obtain a flow identifier (ID) and metadata by a job decoder in the job distribution application;
- initializing and operating the built data center by a runner application in the job distribution application; and
- looking up corresponding device object descriptions in the device pool application by a matcher application in the job distribution application.

20. The non-transitory computer-readable recording medium of claim 11, wherein the data center is comprised of multiple host machines, wherein a host machine is one of a virtual machine (VM) and a hypervisor.

* * * * *